US012101082B2

(12) United States Patent
Tanaka

(10) Patent No.: US 12,101,082 B2
(45) Date of Patent: Sep. 24, 2024

(54) ELASTIC WAVE FILTER, BRANCHING FILTER, AND COMMUNICATION DEVICE

(71) Applicant: KYOCERA Corporation, Kyoto (JP)

(72) Inventor: Hiroyuki Tanaka, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 327 days.

(21) Appl. No.: 17/626,406

(22) PCT Filed: Jul. 8, 2020

(86) PCT No.: PCT/JP2020/026656
§ 371 (c)(1),
(2) Date: Jan. 11, 2022

(87) PCT Pub. No.: WO2021/010245
PCT Pub. Date: Jan. 21, 2021

(65) Prior Publication Data
US 2022/0255533 A1    Aug. 11, 2022

(30) Foreign Application Priority Data

Jul. 12, 2019   (JP) .................................. 2019-130325

(51) Int. Cl.
*H03H 9/64* (2006.01)
*H03H 9/05* (2006.01)
(Continued)

(52) U.S. Cl.
CPC ........ *H03H 9/6483* (2013.01); *H03H 9/0576* (2013.01); *H03H 9/058* (2013.01); *H03H 9/145* (2013.01); *H03H 9/25* (2013.01)

(58) Field of Classification Search
CPC .... H03H 9/0576; H03H 9/058; H03H 9/0585; H03H 9/08; H03H 9/25
(Continued)

(56) References Cited

U.S. PATENT DOCUMENTS

| 5,486,800 A | 1/1996 | Davenport |
| 2010/0225418 A1 | 9/2010 | Kawamoto et al. |
| 2014/0027906 A1* | 1/2014 | Narita ..................... H01L 24/48 257/784 |

FOREIGN PATENT DOCUMENTS

| JP | H7-154201 A | 6/1995 |
| JP | H9-505974 A | 6/1997 |

(Continued)

*Primary Examiner* — Rakesh B Patel
(74) *Attorney, Agent, or Firm* — Procopio, Cory, Hargreaves & Savitch LLP

(57) ABSTRACT

A filter body has a series arm including a plurality of series resonators connected in series with one another and one or more parallel resonators in such a manner that the series arm and the parallel resonators are connected in a ladder form. The series arm has a bent part, and when viewed from an elastic wave propagation direction, a series resonator located closest to a first terminal from a circuit perspective among the plurality of series resonators and a parallel resonator located closest to the first terminal from a circuit perspective among the plurality of parallel resonators do not overlap a series resonator located closest to a second terminal from a circuit perspective among the plurality of series resonators and a parallel resonator located closest to the second terminal from a circuit perspective among the plurality of parallel resonators.

11 Claims, 7 Drawing Sheets

(51) Int. Cl.
*H03H 9/145* (2006.01)
*H03H 9/25* (2006.01)

(58) Field of Classification Search
USPC ........................................ 333/186, 193, 194
See application file for complete search history.

(56) References Cited

FOREIGN PATENT DOCUMENTS

| | | |
|---|---|---|
| JP | 2010-239612 A | 10/2010 |
| JP | 2019-021997 A | 2/2019 |

\* cited by examiner

ELASTIC WAVE FILTER, BRANCHING FILTER, AND COMMUNICATION DEVICE

TECHNICAL FIELD

The present disclosure relates to an elastic wave filter that filters an electric signal, a branching filter including the elastic wave filter, and a communication device including the elastic wave filter. The elastic wave is, for example, a surface acoustic wave (SAW).

BACKGROUND ART

An elastic wave filter configured such that a plurality of elastic wave resonators are connected in a ladder form is known (see, for example, Patent Literatures 1 and 2).

Patent Literature 1 discloses a ladder-form elastic wave filter in which a shielded conductor is provided between an input terminal that inputs a signal to the elastic wave filter or an output terminal that outputs a signal from the elastic wave filter and a wire that transmits a signal in the elastic wave filter.

Patent Literature 2 discloses a duplexer that has a transmission filter that is a ladder-form elastic wave filter and a reception filter that is a ladder-form elastic wave filter. The transmission filter and the reception filter are connected to a single input output terminal and are disposed so as to form a substantially U shape as a whole. Patent Literature 2 also discloses an aspect in which a shielded conductor is provided between a transmission filter and a reception filter.

CITATION LIST

Patent Literature

PTL 1: Japanese Unexamined Patent Application Publication No. 07-154201
PTL 2: Japanese Unexamined Patent Application Publication No. 2010-239612

SUMMARY OF INVENTION

An elastic wave filter according to an aspect of the present disclosure includes a piezoelectric substrate, a first terminal, a second terminal, and a filter body. The filter body is located on the piezoelectric substrate. In the filter body, a series arm and a plurality of parallel resonators are connected in a ladder form. The series arm includes a plurality of series resonators connected in series with one another between the first terminal and the second terminal. The series arm includes a first split arm and a second split arm. The first split arm extends from one side to the other side in a predetermined direction with respect to the piezoelectric substrate and includes at least one of the series resonators. The second split arm is bent from a part of the first split arm on the other side and extends toward the one side and includes at least one of the series resonators. Regions extended along a straight line parallel with an elastic wave propagation direction from a series resonator located closest to the first terminal from a circuit perspective among the plurality of series resonators and a parallel resonator located closest to the first terminal from a circuit perspective among the plurality of parallel resonators do not overlap a series resonator located closest to the second terminal from a circuit perspective among the plurality of series resonators and a parallel resonator located closest to the second terminal from a circuit perspective among the plurality of parallel resonators.

A branching filter according to an aspect of the present disclosure includes an antenna terminal, a transmission filter connected to the antenna terminal, and a reception filter connected to the antenna terminal, wherein at least one of the transmission filter and the reception filter is the elastic wave filter.

A communication device according to an aspect of the present disclosure includes the elastic wave filter, an antenna connected to one end of the series arm, and an IC connected to the other end of the series arm.

DESCRIPTION OF EMBODIMENTS

An embodiment of the present disclosure is described below with reference to the drawings. Note that the drawings used in the following description are schematic views, and dimensional ratios and others on the drawings do not necessarily match actual ones.

(Configuration of SAW Resonator)

Figure 1:
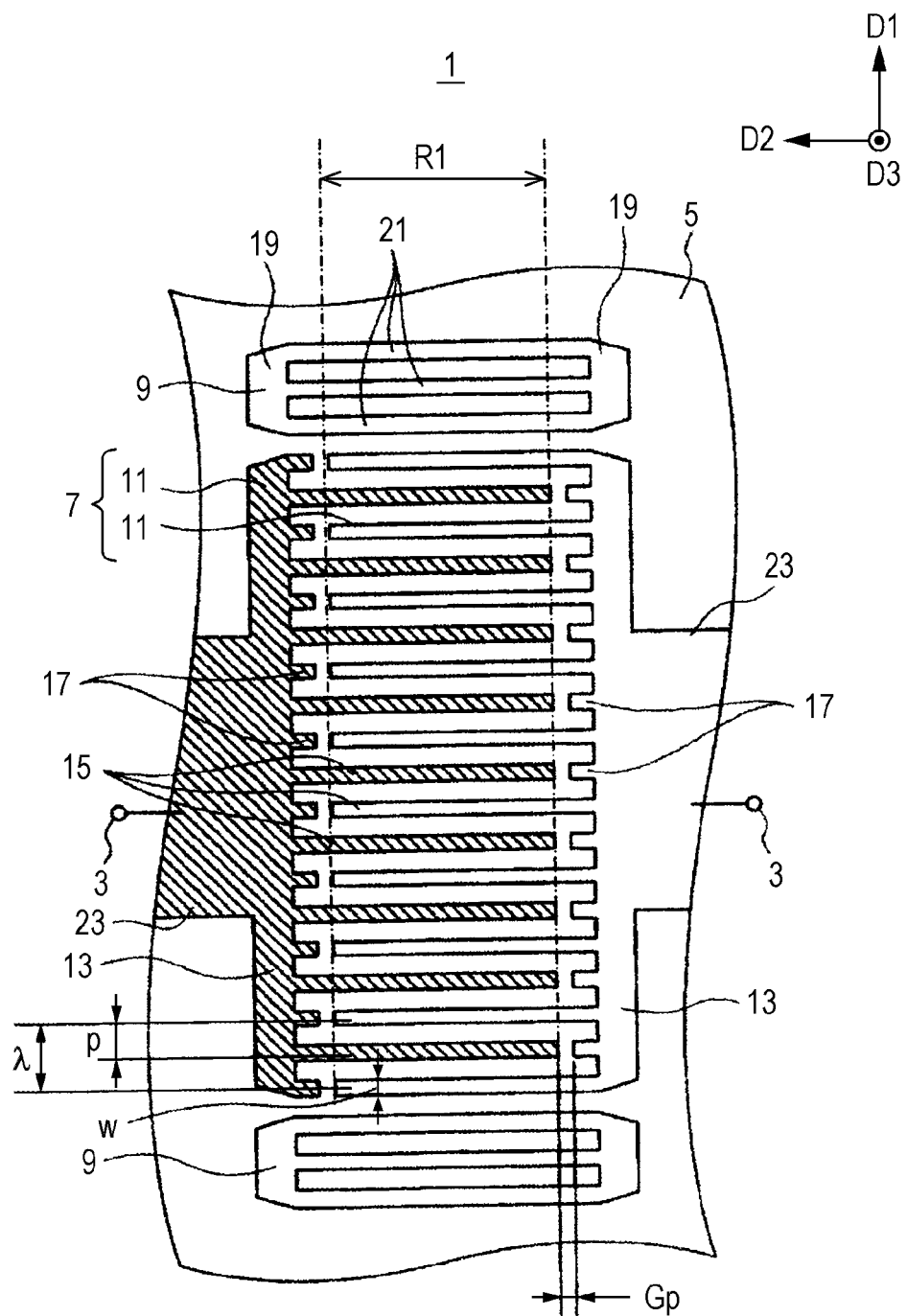
FIG. 1 is a plan view illustrating a configuration of a SAW resonator.

FIG. 1 is a plan view illustrating a configuration of a SAW resonator 1 used in a SAW filter 51 (FIG. 2) according to an embodiment.

Although which side of the SAW resonator 1 (the SAW filter 51) is an upper side or a lower side is not limited, an orthogonal coordinate system made up of a D1 axis, a D2 axis, and a D3 axis is defined for convenience, and terms such as an upper surface are sometimes used in the following description assuming that a positive side (near side of the paper on which FIG. 1 is drawn) of the D3 axis is an upper side. Note that the D1 axis is defined as being parallel with a propagation direction of a SAW that propagates along an upper surface (a surface on the near side of the paper on which FIG. 1 is drawn; normally a widest surface (main surface)) of a piezoelectric substrate 5, which will be described later, the D2 axis is defined as being parallel with the upper surface of the piezoelectric substrate 5 and orthogonal to the D1 axis, and the D3 axis is defined as being orthogonal to the upper surface of the piezoelectric substrate 5.

The SAW resonator 1 is a one-port SAW resonator and produces resonance upon input of an electric signal of a predetermined frequency from one of two terminals 3, which are schematically illustrated, and outputs the signal that has produced the resonance from the other one of the two terminals 3.

Such a SAW resonator 1 has, for example, the piezoelectric substrate 5, an IDT electrode 7 provided on the piezoelectric substrate 5, and a pair of reflectors 9 located on both sides of the IDT electrode 7 on the piezoelectric substrate 5.

As described above, strictly, the SAW resonator 1 includes the piezoelectric substrate 5. In the present embodiment, however, plural combinations of the IDT electrode 7 and the pair of reflectors 9 are provided on the single piezoelectric substrate 5 to constitute plural SAW resonators 1 (1S1, 1P1, . . . ) (see FIG. 2), as described later. Hereinafter, a combination (an electrode part of the SAW resonator 1) of the IDT electrode 7 and one reflector 9 is referred to as a SAW resonator 1 for convenience of description.

The piezoelectric substrate 5 is, for example, made of single crystal having piezoelectricity. The single crystal is, for example, lithium niobate ($LiNbO_3$) single crystal or lithium tantalate ($LiTaO_3$) single crystal. A cut angle may be set as appropriate, for example, in accordance with the kind of a used SAW. For example, the piezoelectric substrate 5 is a rotated Y-cut X-propagating piezoelectric substrate. That is, an X axis is parallel with the upper surface (D1 axis) of the piezoelectric substrate 5, and a Y axis is inclined at a predetermined angle with respect to a normal to the upper surface of the piezoelectric substrate 5. Note that the piezoelectric substrate 5 may be a relatively thin piezoelectric substrate having a support substrate made of an inorganic material or an organic material attached on a rear surface (a surface on a negative side of the D3 axis) thereof. Furthermore, an intermediate layer may be interposed between the piezoelectric substrate 5 and the support substrate. A single intermediate layer may be provided or plural intermediate layers may be laminated.

The IDT electrode 7 and the reflector 9 are made of a layered conductor provided on the piezoelectric substrate 5. The IDT electrode 7 and the reflector 9 are, for example, made of the same material and have the same thickness. The layered conductor of which the IDT electrode 7 and the reflector 9 are made is, for example, a metal. The metal is, for example, Al or an alloy (Al alloy) containing Al as a main component. The Al alloy is, for example, an Al—Cu alloy. The layered conductor may be made up of a plurality of metal layers. A thickness of the layered conductor is set as appropriate, for example, in accordance with electric characteristics required of the SAW resonator 1. For example, the thickness of the layered conductor is equal to or larger than 50 nm and equal to or smaller than 600 nm.

The IDT electrode 7 has a pair of comb electrodes 11 (one of which is hatched for better viewability). Each of the comb electrodes 11 has a bus bar 13, a plurality of electrode fingers 15 that extend in parallel from the bus bar 13, and a plurality of dummy electrodes 17 that protrude from the bus bar 13 between the plurality of electrode fingers 15.

The pair of comb electrodes 11 are disposed so that the plurality of electrode fingers 15 thereof are engaged with (cross) each other. This engaged portion is sometimes referred to as a crossing region R1. The two bus bars 13 of the pair of comb electrodes 11 are disposed so as to face each other, and the electrode fingers 15 of one comb electrode 11 and the electrode fingers 15 of the other comb electrode 11 are basically alternately arranged in a width direction of the comb electrodes 11. Furthermore, front ends of the plurality of dummy electrodes 17 of one comb electrode 11 face front ends of the electrode fingers 15 of the other comb electrode 11.

The bus bar 13 has, for example, an elongated shape extending in a straight manner in a SAW propagation direction (D1 axis direction) so as to have a substantially constant width. The pair of bus bars 13 face each other in a direction (D2 axis direction) orthogonal to the SAW propagation direction. Opposed edges of the pair of bus bars 13 are, for example, parallel with each other. Note that the bus bars 13 may have a changing width or may be inclined with respect to the SAW propagation direction.

Each of the electrode fingers 15 has, for example, an elongated shape extending in a straight manner in a direction (D2 axis direction) orthogonal to the SAW propagation direction so as to have a substantially constant width. The plurality of electrode fingers 15 are, for example, arranged in the SAW propagation direction and have equal lengths. Note that the IDT electrode 7 may be apodized so that lengths (crossing widths from a different perspective) of the plurality of electrode fingers 15 vary depending on a position in the propagation direction.

The number of electrode fingers 15 and a length and a width w (a duty ratio, which is a ratio of the width w to a pitch p, from a different perspective) of the electrode fingers 15 may be set as appropriate, for example, in accordance with electric characteristics required of the SAW resonator 1. The number of electrode fingers 15 illustrated in FIG. 1 and other drawings is small since these drawings are schematic views. Actually, more electrode fingers 15 (for example, 100 or more electrode fingers 15) than those illustrated in FIG. 1 and other drawings may be arranged. The same applies to strip electrodes 21 of the reflector 9, which will be described later.

The pitch p (electrode finger pitch) of the plurality of electrode fingers 15 is, for example, substantially constant throughout the whole IDT electrode 7. Note that the pitch p is, for example, a distance between centers of adjacent two electrode fingers 15 (or strip electrodes 21, which will be described later). The pitch p is basically a half ($p=\lambda/2$) of a wavelength A of a SAW having a frequency equal to a frequency at which resonance is desired among SAWs propagating on the piezoelectric substrate 5.

Each of the dummy electrodes 17 has, for example, an elongated shape protruding in a straight manner in a direction (D2 axis direction) orthogonal to the SAW propagation direction so as to have a substantially constant width. The number of dummy electrodes 17 and a width and a pitch of the dummy electrodes 17 are equal to those of the plurality of electrode fingers 15. Note that the width of the dummy electrodes 17 may be different from that of the electrode fingers 15. The IDT electrode 7 may be configured not to have the dummy electrodes 17. In the following description, description and illustration of the dummy electrodes 17 may be omitted.

As described earlier, the front ends of the plurality of electrode fingers 15 of one comb electrode 11 and the other comb electrode 11 (more specifically, the front ends of the dummy electrodes 17 of the other comb electrode 11 in the present embodiment) face each other with a gap Gp interposed therebetween in a direction (D2 axis direction) in which the plurality of electrode fingers 15 extend. A size of the gap Gp in the D2 axis direction is, for example, equal among the plurality of electrode fingers 15.

The reflector 9 is, for example, formed in a grid manner. That is, the reflector 9 has a pair of bus bars 19 that face each other and a plurality of strip electrodes 21 extending between the pair of bus bars 19.

Shapes of the bus bars 19 and the strip electrodes 21 may be similar to those of the bus bars 13 and the electrode fingers 15 of the IDT electrode 7 except for that both ends of the strip electrodes 21 are connected to the pair of bus bars 19.

The pair of reflectors 9 are, for example, adjacent to both sides of the IDT electrode 7 in the SAW propagation direction. Accordingly, the plurality of strip electrodes 21 are arranged next to the arrangement of the plurality of electrode fingers 15. A pitch between a strip electrode 21 and an electrode finger 15 that are adjacent between the reflector 9 and the IDT electrode 7 is, for example, equal to the pitch between the plurality of electrode fingers 15 (and the plurality of strip electrodes 21).

Note that the upper surface of the piezoelectric substrate 5 may be covered with a protection film (not illustrated) made of a material such as $SiO_2$ on top of the IDT electrode 7 and the reflector 9. The protection film may be thinner than the IDT electrode 7 or may be thicker than the IDT electrode 7. Furthermore, for example, in a case where the protection film is provided, an additional film made of an insulator or a metal may be provided on upper surfaces or lower surfaces of the IDT electrode 7 and the reflector 9 in order to improve a SAW reflection coefficient.

The terminals 3 and the bus bars 13 are electrically connected by wires 23.

When a voltage is applied to the pair of comb electrodes 11, the voltage is applied to the piezoelectric substrate 5 by the electrode fingers 15, and a SAW of a predetermined mode propagating in the D1 axis direction along the upper surface of the piezoelectric substrate 5 close to the upper surface is excited. The excited SAW is mechanically reflected by the electrode fingers 15. As a result, a standing wave whose half wavelength is the pitch of the electrode fingers 15 is formed. The standing wave is converted into an electric signal having a frequency identical to the standing wave and is taken out by the electrode fingers 15. In this way, the SAW resonator 1 functions as a resonator. A resonance frequency of the SAW resonator 1 is substantially identical to a frequency of a SAW whose half wavelength is the electrode finger pitch and propagating on the piezoelectric substrate 5.

The SAW excited in the IDT electrode 7 is mechanically reflected by the strip electrodes 21 of the reflector 9. Furthermore, since adjacent strip electrodes 21 are connected to each other by the bus bars 19, the SAW from the IDT electrode 7 is also electrically reflected by the strip electrodes 21. This suppresses spread of the SAW, and as a result the standing wave in the IDT electrode 7 strongly stands and the function of the SAW resonator 1 as a resonator improves.

Note that "connection" used in relation to the SAW resonator 1 refers to connection in such a manner that a voltage is applied to the pair of comb electrodes 11 as schematically illustrated by the two terminals 3 unless otherwise specified.

In a part (for example, less than 50% or less than 5% of the total number of pitches p) of the IDT electrode 7, a pitch p different from a pitch p of a large part of the IDT electrode 7 may be set for improvement or fine adjustment of characteristics. For example, the IDT electrode 7 may include, on both sides in the SAW propagation direction, a narrow-pitch part in which the pitch p is smaller than that in the other large part. Furthermore, the electrode fingers 15 may be thinned out. For example, a predetermined number of (for example, 1 to 3) electrode fingers 15 of the pair of comb electrodes 11 that are alternately arranged may be removed or a change of the width w or arrangement of the electrode fingers 15 substantially equivalent to this removal may be made. When the pitch p, the width w, or the duty ratio (w/p) is mentioned in the present disclosure, such a unique part is not considered unless otherwise specified. In a case where the pitch p or the width w fluctuates within a minute range throughout the whole IDT electrode 7, an average thereof may be used.

(Outline of SAW Filter)

Figure 2:
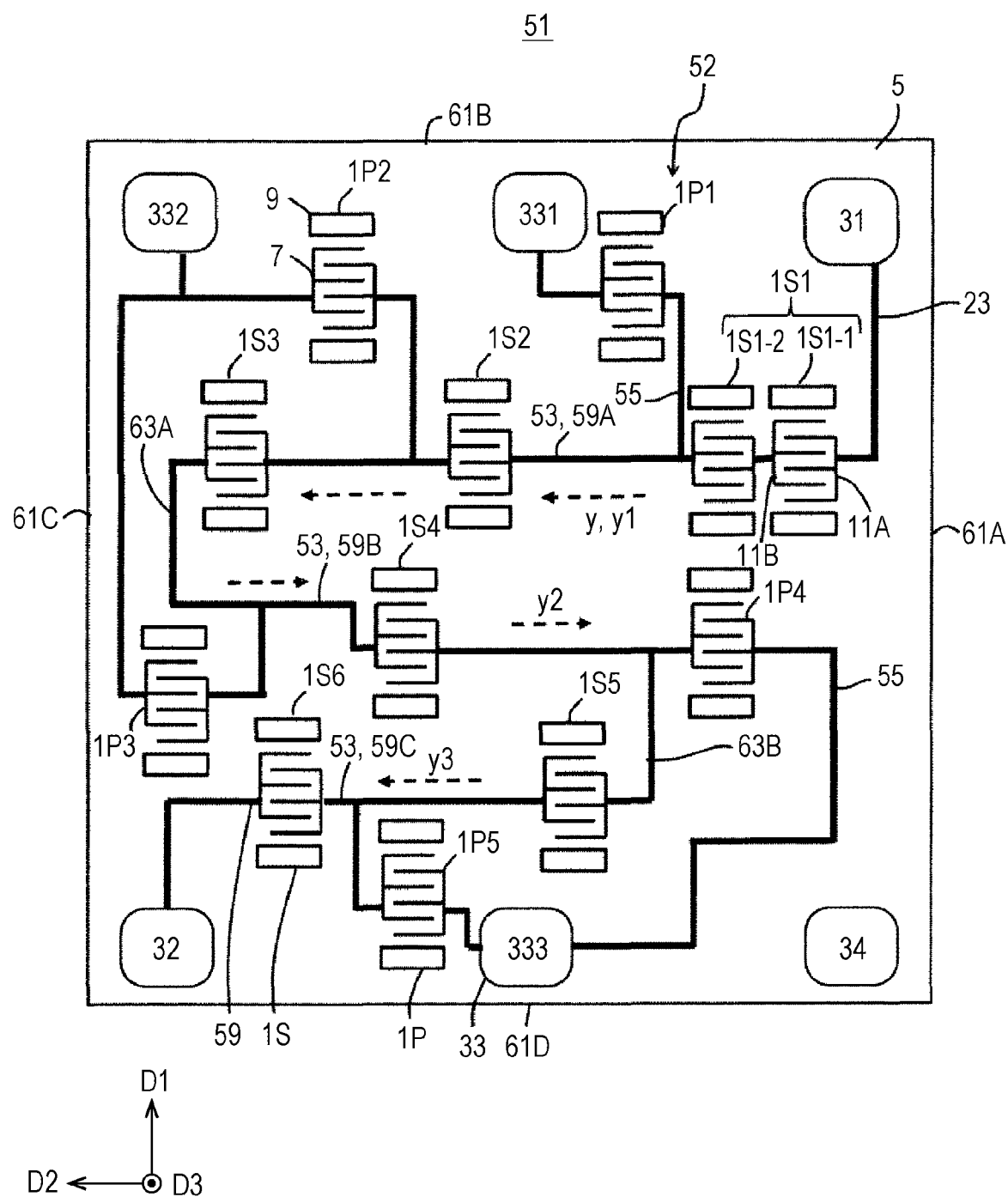
FIG. 2 is a plan view schematically illustrating a configuration of a SAW filter including the SAW resonator of FIG. 1.

FIG. 2 is a plan view schematically illustrating a configuration of the SAW filter 51 including the SAW resonator 1. As is understood from the reference signs of the IDT electrode 7 and the reflector 9 illustrated on an upper left side of the paper on which FIG. 2 is drawn, these conductors are illustrated more schematically than FIG. 1.

The SAW filter 51 has the piezoelectric substrate 5 that has been already described. The SAW filter 51 has, on the piezoelectric substrate 5, various terminals 3 (e.g., 31 and 32) to and from which a signal is input and output and a filter body 52 that filters a signal.

The plurality of terminals 3 may include, for example, an input terminal 31 (first terminal) to which an electric signal is input from an outside of the SAW filter 51, an output terminal 32 (second terminal) that outputs an electric signal to an outside, first to third GND terminals 331 to 333 to which a reference potential is given from an outside, and a dummy terminal 34 for joining. Note that the SAW filter 51 may be one that uses the input terminal 31 as an output terminal and uses the output terminal 32 as an input terminal.

Note that the first to third GND terminals 331 to 333 are sometimes referred to simply as "GND terminals 33" without distinction. The input terminal 31, the output terminal 32, and/or the GND terminals 33, for example, correspond to the terminals 3 illustrated in FIG. 1. These terminals are sometimes referred to simply as terminals 3 without distinction.

The filter body 52 is configured to filter an electric signal from the input terminal 31 and output the electric signal to the output terminal 32. Furthermore, the filter body 52 is configured to release an unnecessary component (a signal outside a pass band) included in the electric signal to the GND terminals 33 when filtering the electric signal.

The filter body 52 is configured such that a plurality of SAW resonators 1 (1S1 to 1S6 and 1P1 to 1P5 in the example illustrated in FIG. 2) are connected in a ladder form from a circuit perspective between the input terminal 31, the output terminal 32, and one or more GND terminals 33. The plurality of terminals 3 and the plurality of SAW resonators 1 are connected by a plurality of wires 23.

Note that a package and/or a mounting structure of the SAW filter 51 may have various aspects. For example, the SAW filter 51 is packaged or mounted in a manner such that the upper surface (surface on a +D3 side) of the piezoelectric substrate 5 faces a circuit substrate (not illustrated) and the various terminals 3 and pads of the circuit substrate are joined by bumps. Alternatively, for example, the upper surface of the piezoelectric substrate 5 is covered with a box-shaped cover (not illustrated), and pillar-shaped conductors (not illustrated) that penetrate the cover are provided so as to stand on the various terminals 3. The SAW filter is mounted in a manner such that an upper surface of the cover faces the circuit substrate (not illustrated) and the pillar-shaped conductors exposed from the upper surface of the cover and pads of the circuit substrate are joined by bumps.

(Terminals and Wires)

The terminals 3 and the wires 23 are constituted by a conductor layer located on the upper surface of the piezoelectric substrate 5. The conductor layer is, for example, identical (identical in terms of material and thickness) to the conductor layer that constitutes the IDT electrode 7 and the reflector 9. However, a conductor layer made of another material may be provided at positions of the terminals 3 on a conductor layer common to the IDT electrode 7, the reflector 9, and the wires 23. Needless to say, the terminals 3, the wires 23, and other conductor layers may be made of different materials.

A shape, a dimension, and the like of the terminals 3 may be set as appropriate. Note that the terminals 3 need not be distinguishable from the wires 23 by their configuration (a shape, a material, or the like) and may be parts of the wires 23. For example, the positions or ranges of the terminals 3 may be specified by an insulating layer that covers the wires 23 and does not cover the terminals 3 or may be specified by members (e.g., bumps) that make contact with the terminals 3 when the piezoelectric substrate 5 is packaged.

All of or some of the GND terminals 33 may be short-circuited with each other or may be configured not to be short-circuited with each other.

Specific path, width, and the like of the wires 23 may be set as appropriate. In FIG. 2, wires that have a constant width and are relatively thin are illustrated as the wires 23 for convenience. However, the wires 23 may have a changing width, may be relatively thick as illustrated in FIG. 1, and may have a part having a width equal to a length (D1 axis direction) of the bus bars 13. Although the wires 23 are routed in parallel with the D1 axis direction or the D2 axis direction for convenience in FIG. 2, the wires 23 may be inclined with respect to the D1 axis direction or the D2 axis direction. Although the wires 23 do not overlap each other in the example illustrated in FIG. 2, there may be a portion where the wires 23 cross each other at different levels with an insulator interposed therebetween.

(Connection Relationship Among SAW Resonators in Filter Body)

The filter body 52 is constituted by ladder-form SAW filters. That is, the filter body 52 has a series arm 53 (arrows y are illustrated along the series arm 53) that connects the input terminal 31 and the output terminal 32 and one or more (a plurality of (five) in the example illustrated in FIG. 2) parallel arms 55 that connect the series arm 53 and the GND terminals 33. The series arm 53 contributes to transmission of a signal in a pass band. The parallel arm 55 contributes to leading a signal outside the pass band to the GND terminals 33. Note that in the present embodiment, a case where plural parallel arms 55 are provided is taken as an example basically.

The series arm 53 includes first to sixth series resonators 1S1 to 1S6 (hereinafter sometimes referred to simply as "series resonators 1S" without distinction) that are connected in series between the input terminal 31 and the output terminal 32. Each of the parallel arms 55 has any of first to fifth parallel resonators 1P1 to 1P5 (hereinafter sometimes referred to simply as "parallel resonators 1P" without distinction) that connect an input side (input terminal 31 side) or an output side (output terminal 32 side) of the series resonator 1S and the GND terminal 33. The plurality of parallel arms 55 (the parallel resonators 1P) are connected to the series arm 53 at positions electrically different from one another (positions that are different from one another in relative relations with the series resonator 1S).

Note that in the description of the present embodiment, a case where the series arm 53 (one or more series resonators 1S from a different perspective) and the parallel arms 55 (one or more parallel resonators 1P from a different perspective) are connected in a ladder form indicates a state where the series arm 53 (one series resonator or plural series resonators 1S that are connected in series from a different perspective) is connected between the input terminal 31 and the output terminal 32 and one or more parallel arms 55 (one or more parallel resonators 1P from a different perspective) are connected between an input side or an output side of the one or more series resonators 1S and the GND terminal 33 as described above.

The number of series resonators 1S and the number of parallel resonators 1P may be set as appropriate, and the numbers illustrated in FIG. 2 are merely an example. Although no parallel resonator 1P is connected to an input side of the first series resonator 1S1 closest to the input terminal 31 in the example illustrated in FIG. 2, the parallel resonator 1P may be connected to the input side of the first series resonator 1S1. Similarly, although no parallel resonator 1P is connected to an output side of the sixth series resonator 1S6 closest to the output terminal 32, the parallel resonator 1P may be connected to the output side of the sixth series resonator 1S6.

The plurality of parallel resonators 1P may be individually (on one-to-one basis) connected to the plurality of GND terminals 33 that are not short-circuited with each other or all of or some of the plurality of parallel resonators 1P may be connected to an identical GND terminal 33 or a plurality of GND terminals 33 that are short-circuited with each other. In the example illustrated in FIG. 2, the first parallel resonator 1P1 is connected to the first GND terminal 331, the second parallel resonator 1P2 and the third parallel resonator 1P3 are connected to the second GND terminal 332, and the fourth parallel resonator 1P4 and the fifth parallel resonator 1P5 are connected to the third GND terminal 333.

Each of the series resonators 1S and the parallel resonators 1P is, for example, the SAW resonator 1 described with reference to FIG. 1. Note, however, that specific values such as the number of electrode fingers 15 and the length and/or the pitch p of the electrode fingers 15 are set in accordance with characteristics required of each resonator.

Each of the series resonators 1S and the parallel resonators 1P may be constituted by a single SAW resonator 1 or may be constituted by a plurality of SAW resonators 1. In the example illustrated in FIG. 2, the first series resonator 1S1 is constituted by two SAW resonators 1 (a first split resonator 1S1-1 and a second split resonator 1S1-2), and the other resonators are each constituted by a single SAW resonator 1. From a different perspective, it may be grasped that the first series resonator 1S1 is constituted by a single SAW resonator 1 split into a plurality of (two in this example) SAW resonators 1.

The first split resonator 1S1-1 and the second split resonator 1S1-2 are connected in series with each other. The connection may be achieved by the wire 23 or may be achieved by sharing the bus bar 13 with each other. The first split resonator 1S1-1 and the second split resonator 1S1-2 have, for example, a substantially identical configuration. Note, however, that the first split resonator 1S1-1 and the second split resonator 1S1-2 may have different configurations.

By thus splitting a single series resonator 1S or a single parallel resonator 1P, it is, for example, possible to lower a voltage applied to a single SAW resonator 1 (in this example, the first split resonator 1S1-1 or the second split resonator 1S1-2) and improve power durability of the whole series resonator 1S or the whole parallel resonator 1P. In a case where the SAW filter 51 is a transmission filter (described later) used for wireless communication, an intensity of an electric signal on the input terminal 31 side is higher than that on the output terminal 32 side. In this case, power durability of the whole SAW filter 51 can be improved by splitting the SAW resonator 1 closest to the input terminal 31 as in the example illustrated in FIG. 2.

Note that in a case where a plurality of SAW resonators 1 that are connected in series are provided in the series arm 53, whether each SAW resonator 1 is a split resonator or constitutes the series resonator 1S by itself may be specified on the basis of a position of connection with the parallel arm 55. For example, in a case where the parallel arm 55 is not connected between two SAW resonators 1 that are connected in series with each other, the two SAW resonators 1 may be regarded as split resonators that constitute a single series resonator 1S.

(Shape of Path of Series Arm)

The SAW filter 51 is configured such that the series arm 53 is bent (in a substantially U shape) somewhere along its path on the piezoelectric substrate 5 as is understood from the arrows y (y1, y2, and y3) given along the series arm 53. The number of bends is not limited as long as the series arm 53 is bent at one or more points. In this example, the path is bent at two points to form a substantially S shape as a whole. In other words, the series arm 53 has a first split arm 59A that extends from one side (−D2 side) toward the other side (+D2 side) in a predetermined direction (D2 axis direction) on the piezoelectric substrate 5 (extends in a direction indicated by the arrow y1), a second split arm 59B that is bent from the other side (+D2 side) of the first split arm 59A and extends toward the one side (−D2 side) (in a direction indicated by the arrow y2), and a third split arm 59C that is bent from the one side (−D2 side) of the second split arm 59B toward the other side (+D2 side) (in a direction indicated by the arrow y3) (hereinafter sometimes referred to simply as "split arms 59" without distinction). Configurations of these members are specifically as follows, for example.

The piezoelectric substrate 5 is, for example, substantially rectangular in plan view and has four sides. A side on the −D2 side, a side on the +D1 side, a side on the +D2 side, and a side on the −D1 side are referred to as a first side 61A, a second side 61B, a third side 61C, and a fourth side 61D, respectively.

In this example, the input terminal 31 is located close to the first side 61A relative to a center of a region where electrodes of the SAW filter 51 are disposed, and the output terminal 32 is located close to the third side 61C relative to the center of the region where the electrodes of the SAW filter 51 are disposed. The input terminal 31 and the output terminal 32 are located diagonally opposite to each other on the rectangular piezoelectric substrate 5. It is therefore possible to reduce interference between the input and output terminals.

The first split arm 59A substantially extends from the input terminal 31 toward the +D2 side (toward the third side 61C, which faces the first side 61A) and reaches a bent part (a connection part between the first split arm 59A and the second split arm 59B) 63A. The bent part 63A is, for example, constituted by the wire 23 that connects the two series resonators 1S3 and 1S4 and is located relatively close to the third side 61C.

The second split arm 59B substantially extends from the bent part 63A toward the −D2 side (toward the first side 61A) and reaches a bent part 63B. The bent part 63B is, for example, constituted by the wire 23 that connects the two series resonators 1S4 and 1S5.

The third split arm 59C substantially extends from the bent part 63B located at an end of the second split arm 59B on the −D2 side toward the +D2 side (toward the third side 61C) and reaches the output terminal 32.

Of the pair of comb electrodes 11 of the series resonator 1S, a comb electrode 11 located on the input terminal 31 side (input side, one side) regarding flow of an electric signal is referred to as an input-side comb electrode 11A, and a comb electrode 11 located on the output terminal 32 side (output side, other side) regarding flow of an electric signal is referred to as an output-side comb electrode 11B (see the reference signs on the right side of the paper on which FIG. 2 is drawn). That is, of the pair of comb electrodes 11, a comb electrode 11 that is connected to the input terminal 31 with or without another series resonator 1S interposed therebetween is the input-side comb electrode 11A, and a comb electrode 11 that is connected to the output terminal 32 with or without another series resonator 1S interposed therebetween is the output-side comb electrode 11B. Furthermore, a direction from the bus bar 13 of the input-side comb electrode 11A toward the bus bar 13 of the output-side comb electrode 11B along the D2 axis direction is, for example, sometimes referred to as a direction from the input-side comb electrode 11A toward the output-side comb electrode 11B with respect to the piezoelectric substrate 5.

The bent parts 63A and 63B are sometimes referred as bent part 63 (see FIG. 3) without distinction. Having the "bent part 63" means that the split arms 59 are reverse in flow of a signal travelling from the terminal 31 toward the terminal 32. The expression "reverse in flow of a signal" means that an angle formed between two vectors is more than 90° and less than 270° in a case where flow of a signal in each split arm is indicated by a vector. In other words, the expression "reverse in flow of a signal" means including a resonator that is reverse in terms of a direction from the input-side comb electrode 11A toward the output-side comb electrode 11B. In the example illustrated in FIG. 2, two pairs of split arms 59, specifically, a pair of the first split arm 59A and the second split arm 59B and a pair of the second split arm 59B and the third split arm 59C are each reverse in flow of a signal. Note that in a case where a U shape is formed, one pair of split arms 59 are reverse in flow of a signal.

By thus providing the bent parts 63 somewhere along the path, it is possible to reduce an area of the region where the electrodes that constitute the SAW filter 51 are disposed, thereby contributing a reduction in size of the SAW filter 51. Furthermore, a straight-line distance between the terminal 31 and the terminal 32 can be increased by making the path of the series arm 53 S-shaped. In other words, the terminal 31 and the terminal 32 can be disposed diagonally opposite to each other. This can prevent, for example, interference between the terminals.

(Layout of Resonators)

In a case where the series arm 53 includes the bent parts 63 as described above, a plurality of resonators 1 overlap in the D1 direction in some cases. In other words, another resonator 1 is located on a line extended from one resonator 1 in the D1 direction in some cases.

Meanwhile, according to the SAW filter 51 according to the present disclosure, both of the resonators (1S1 and 1P1) located closest to the input terminal 31 from a circuit perspective are disposed so as not to overlap, in the D1 direction, the resonators (1S6 and 1P5) located closest to the signal terminal 32 from a circuit perspective.

The state where resonators "overlap" in the D1 direction means that the crossing regions R1 where the electrode fingers 15 of the SAW resonators 1 cross each other overlap each other in the D1 direction. In other words, it can be said that two resonators 1 do not overlap each other as long as the crossing regions R1 do not overlap each other even though the bus bars 13 and the dummy electrodes 17 of the resonators 1 overlap each other. More specifically, it can be said that two SAW resonators 1 "do not overlap" each other in the D1 direction as long as the other SAW resonator 1 is not located within a region extended in the D1 direction from the crossing region R1 of one SAW resonator 1.

Furthermore, the expression "located closest to the input terminal from a circuit perspective" is distinguished from a positional relationship in layout in plan view and indicates a positional relationship on a circuit diagram illustrating electric connection among resonators. That is, a "resonator located closest to the input terminal from a circuit perspective" refers to a series resonator located closest to the input terminal and a parallel resonator located closest to the input terminal along flow of a high-frequency signal. Similarly, the expression "located closest to the output terminal from a circuit perspective" is distinguished from a positional relationship in layout in plan view and indicates a positional relationship on a circuit diagram illustrating electric connection among resonators. That is, a "resonator located closest to the output terminal from a circuit perspective" refers to a resonator located closest to the output terminal along flow of a high-frequency signal.

In the example illustrated in FIG. 2, the resonators 1S6 and 1P5 are disposed not to overlap the resonator 1S1 and the resonator 1P1. By thus disposing the resonators, it is possible to prevent interference between resonators directly below terminals, and it is therefore possible to provide the SAW filter 51 excellent in electric characteristics.

Although an example in which all of the resonators 1P1, 1S1, 1P5, and 1S6 do not overlap in the D1 direction has been described in the above example, a configuration in which at least one of these resonators does not overlap has an effect of increasing electric characteristics as compared with a case where all of these resonators overlap. Even if the SAW resonator 1S1 and the SAW resonator 1P1 overlap in the D1 direction, influence on the characteristics is small, but if the SAW resonator 1S1 and the SAW resonator 1S6 or the SAW resonator 1P5 overlap and if the SAW resonator 1P1 and the SAW resonator 1S6 or the SAW resonator 1P5 overlap, the electric characteristics are influenced.

Furthermore, in a case where the piezoelectric substrate 5 is relatively thin and a support substrate made of an inorganic material or an organic material is directly or indirectly attached to a rear surface (a surface on a negative side in the D3 axis), an elastic wave propagates farther than a case where a thick piezoelectric substrate is used. Accordingly, in a case where the piezoelectric substrate 5 is thin (1λ or less), influence of interference of the elastic wave is large, and therefore layout of resonators is important.

(Modifications)

Figure 3:
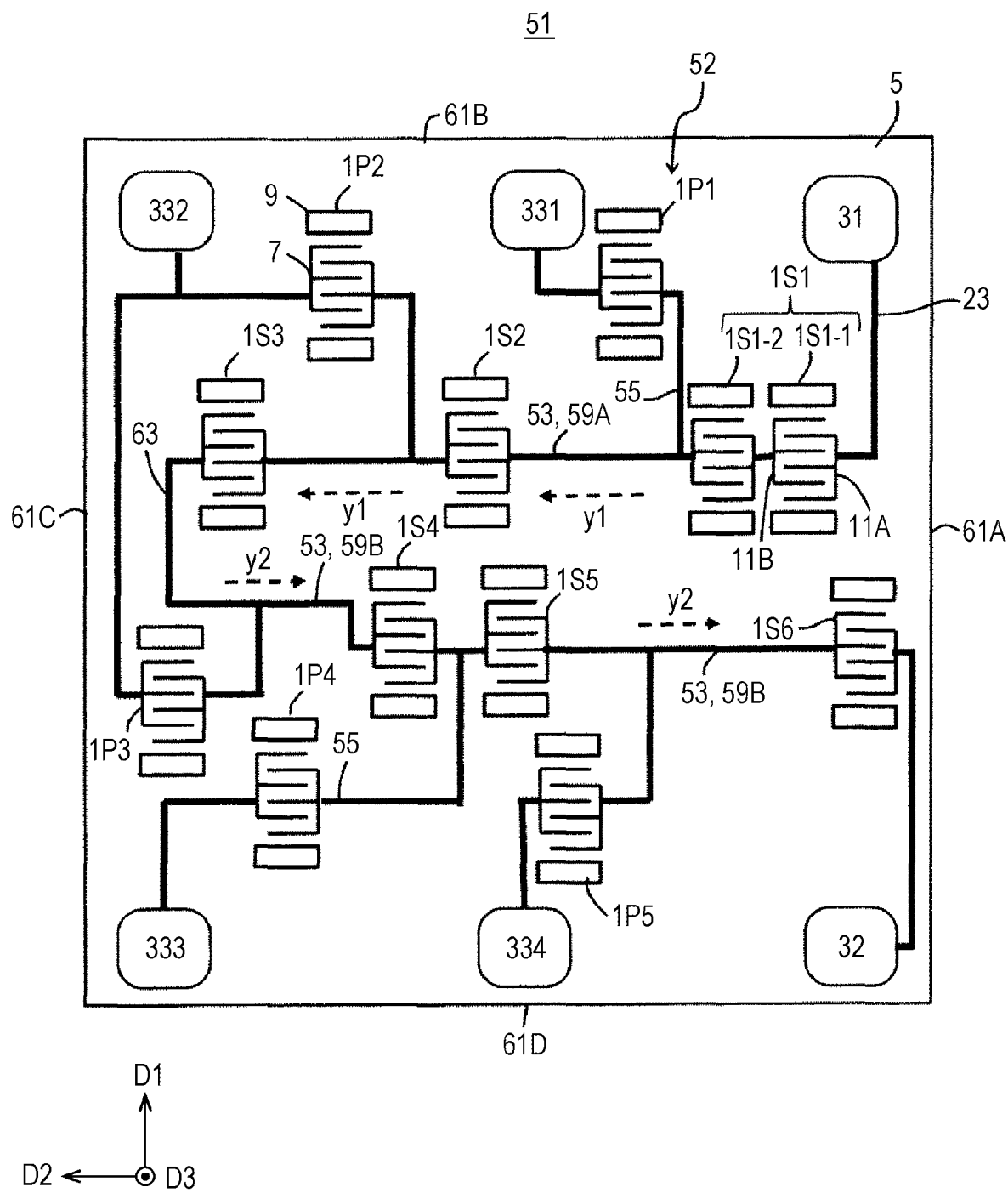
FIG. 3 is a plan view schematically illustrating a configuration of a modification of the SAW filter of FIG. 2.

Although an example in which the path of the series arm 53 has an S shape has been described above, this is not restrictive. For example, the path may be U-shaped as illustrated in FIG. 3. That is, a single bent part 63 may be provided, and a first split arm 59A extending in the y1 direction and a second split arm 59B extending on a y2 direction opposite to the y1 direction may be electrically connected at the bent part 63 to form a substantially U shape.

Figure 4:
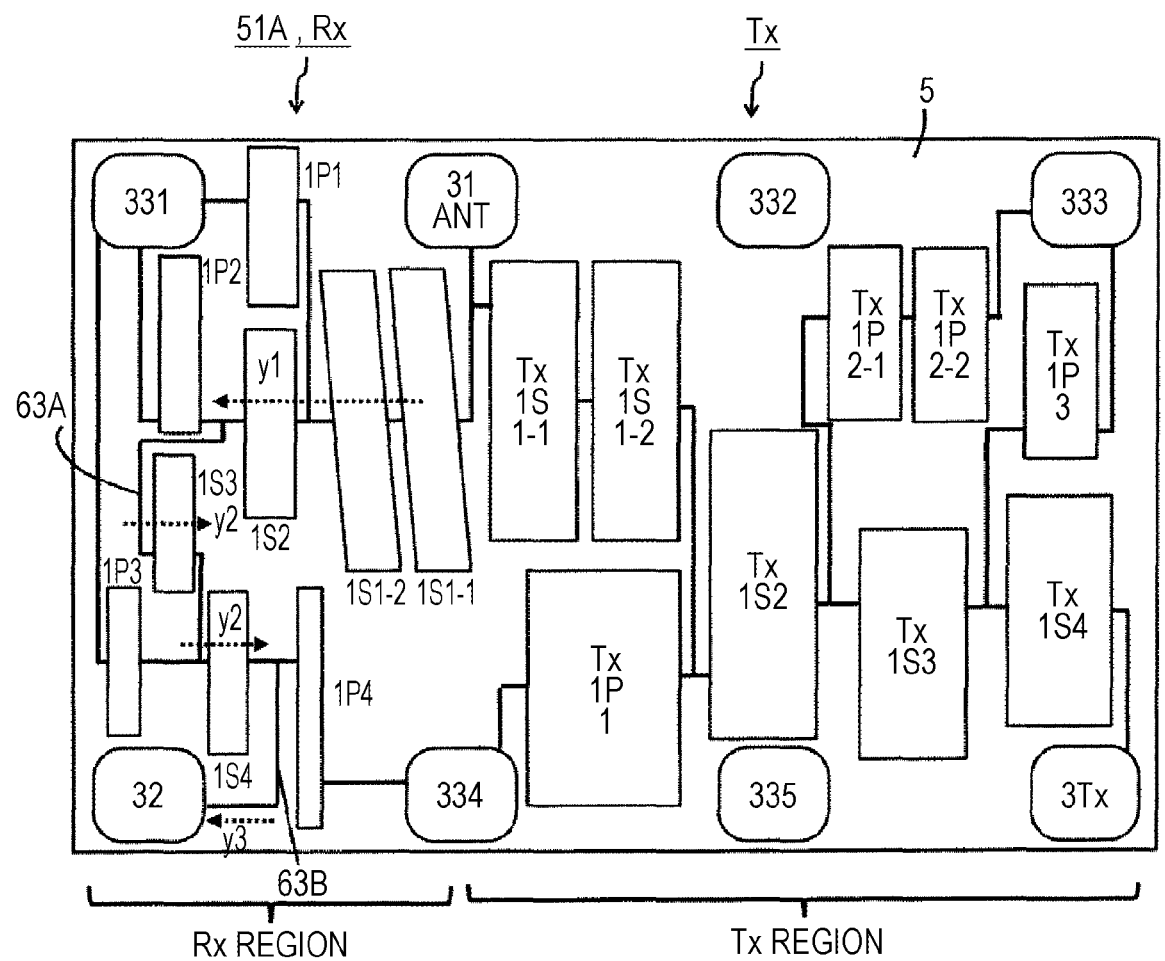
FIG. 4 is a plan view schematically illustrating a configuration of a modification of the SAW filter of FIG. 2.

Furthermore, as illustrated in FIG. 4, two or more filters including an elastic wave filter 51A may be provided on a single piezoelectric substrate 5. In the example illustrated in FIG. 4, a transmission filter Tx is provided in a region on the right side in FIG. 4, and the SAW filter 51A functioning as a reception filter Rx is provided in a region on the left side in FIG. 4.

In FIG. 4, the shape of the SAW resonator 1 is further simplified as compared with FIGS. 2 and 3. Specifically, an outer edge of the IDT electrode 7 is illustrated as a rectangle, and illustration of the reflector 9 is omitted.

The transmission filter Tx and the SAW filter 51A share the terminal 31 as a terminal that transmits and receives a signal to and from an antenna. That is, FIG. 4 illustrates an example of a branching filter including two filters. In the Tx filter, a plurality of SAW resonators 1 are connected in a ladder form. The series arm 53 including no bent part extends in one direction from the terminal 31 to a terminal 3Tx to which a transmission signal is input. In other words, a positional relationship between the input-side comb electrode 11A and the output-side comb electrode 11B in the series resonator 1S in plan view is not reversed.

Note that the number of resonators in the SAW filter 51A is different from that in the SAW filter 51. Specifically, the SAW filter 51A includes series resonators 1S1 to 1S4 and parallel resonators 1P1 to 1P4. The series resonator 1S1 is located directly below an antenna and is therefore split into split resonators, and a direction in which bus bars extend is inclined with respect to a direction (D2) orthogonal to the D1 direction in order to suppress spurious emission in a lateral direction. Furthermore, a first bent part 63A is located between the resonator 1S2 and the resonator 1S3, and a second bent part 63B is located between the resonator 1S4 and the resonator 1P4. The resonator 1S4 is located on the first bent part 63A side (+D2 side) relative to the resonator 1S1 and the resonator 1P1, and the resonator 1P4 is located between the resonator 1S1 and the resonator 1P1.

The transmission filter Tx and the reception filter Rx are arranged side by side in a direction orthogonal to a SAW propagation direction.

The transmission filter Tx needs higher power than the reception filter Rx, and therefore there is a possibility that the number, size, and the like of resonators that constitute the transmission filter Tx are larger than those of resonators that constitute the reception filter Rx. As a result, in some cases, a region (hereinafter referred to as an Rx region) where electrodes that constitute the reception filter Rx are disposed is smaller than a region (hereinafter referred to as a Tx region) where electrodes that constitute the transmission filter are disposed. For example, an area of the Rx region is equal to or smaller than a half of an area of the Tx region.

In such a case, in a case where the elastic wave filter 51 or 51A according to the present disclosure is used as a reception filter, resonators can be disposed even in a limited space without deteriorating electric characteristics. Note that the reception filter has the effect produced by providing a bent part in the series arm 53 especially when a length of the Rx region in the D2 direction is shorter than a sum of widths, in the D2 direction, of the resonators that constitute the reception filter.

(Verification of Effect)

As an example, filter characteristics of the SAW filter 51A were measured in the branching filter illustrated in FIG. 4. Similarly, a filter in which arrangement of resonators in the SAW filter 51A was not considered was produced as a comparative example, and filter characteristics thereof were measured. Specifically, in a reception filter according to the comparative example, a resonator close to the input terminal (31) and a resonator close to the output terminal (32) overlap in the D1 direction.

Figure 5:
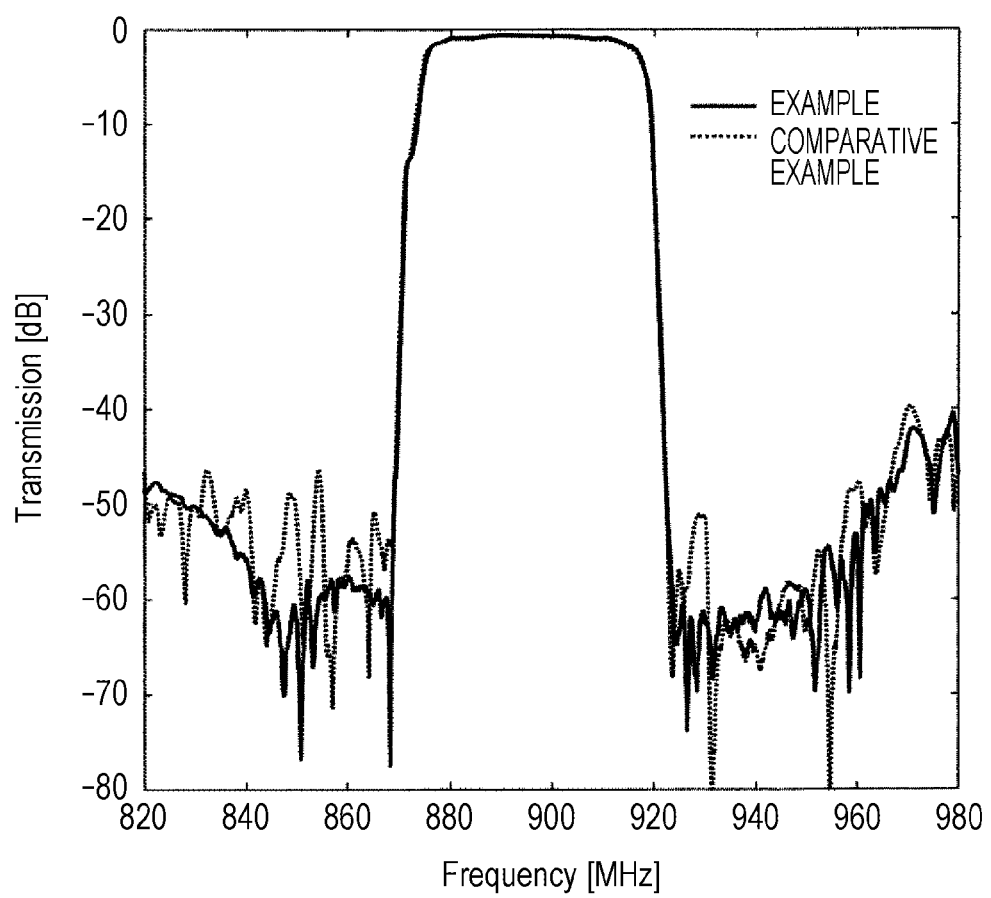
FIG. 5 is a graph illustrating frequency characteristics of the SAW filter illustrated in FIG. 4 and a SAW filter according to a comparative example.

FIG. 5 illustrates filter characteristics. FIG. 5 illustrates transmission characteristics. The horizontal axis represents a frequency (unit: MHz). The vertical axis represents transmission characteristics (unit: dB). The straight line represents characteristics according to the example. The broken line represents characteristics according to the comparative example.

As is clear from FIG. 5, it was confirmed that attenuation characteristics on a low frequency side of a pass band improved in a reception filter using the SAW filter 51A according to the present disclosure. Specifically, spurious emission was confirmed a lot on a low frequency side of a pass band in the comparative example, but spurious emission was reduced in the example.

It was thus confirmed that according to the SAW filter according to the present disclosure, attenuation characteristics are high, and as a result, a SAW filter excellent in electric characteristics can be provided.

(Use Example of Elastic Wave Filter: Branching Filter)

Figure 6:
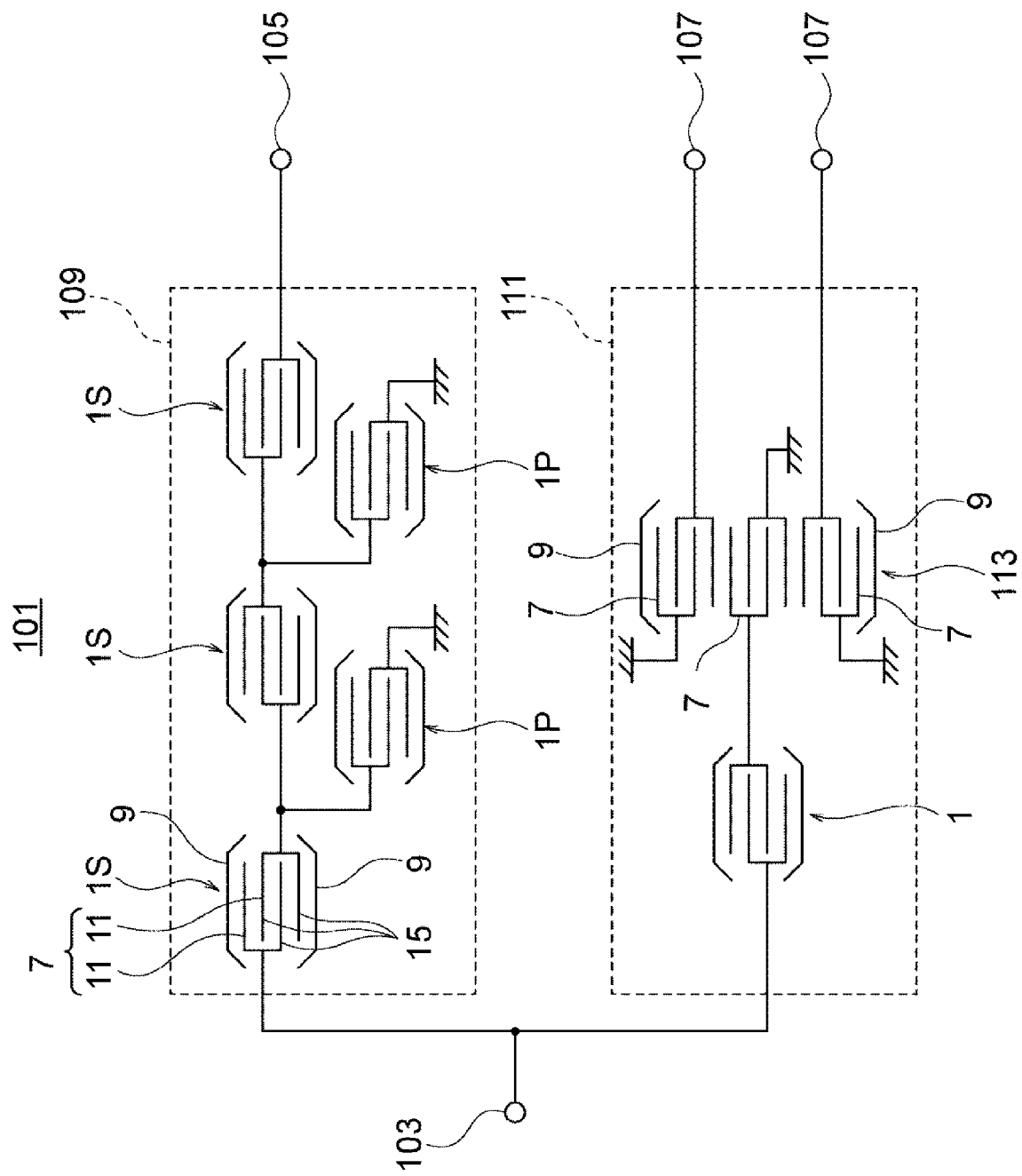
FIG. 6 schematically illustrates a branching filter as a use example of the SAW filter of FIG. 2.

FIG. 6 is a circuit diagram schematically illustrating a configuration of a branching filter 101 (e.g., a duplexer) as a use example of the SAW filter 51 or 51A. As is understood from the reference signs on an upper left side of the paper on which FIG. 6 is drawn, the comb electrodes 11 are schematically illustrated as a two-pronged fork shape and the reflector 9 is illustrated as a single line whose both ends are bent in FIG. 6. In FIG. 6, the number of series resonators 1S and the number of parallel resonators 1P are reduced as compared with those in FIG. 2, and specific arrangement (e.g., a S shape of a series arm) of the SAW resonators 1 on the piezoelectric substrate 5 is omitted.

The branching filter 101 has, for example, a transmission filter 109 that filters a transmission signal from a transmission terminal 105 and outputs the signal to an antenna terminal 103 and a reception filter 111 that filters a reception signal from the antenna terminal 103 and outputs the reception signal to a pair of reception terminals 107.

Although an example in which the SAW filter 51A is applied to a reception filter has been described in the example illustrated in FIG. 4, the transmission filter 109 is, for example, the SAW filter 51 (or 51A) according to the embodiment. The transmission terminal 105 is the input terminal 31 or a terminal connected to the input terminal 31. The antenna terminal 103 is the output terminal 32 or a terminal connected to the output terminal 32.

The reception filter 111 includes, for example, the SAW resonator 1 and a multiple mode type filter (including a double mode type filter) 113. The multiple mode type filter 113 has a plurality of (three in the example illustrated in FIG. 6) arranged in a direction in which an elastic wave propagates and a pair of reflectors 9 disposed on both sides of the plurality of IDT electrodes 7. Note that the SAW resonator 1 and the multiple mode type filter 113 that constitute the reception filter 111 are, for example, provided on the same piezoelectric substrate 5.

Note that the transmission filter 109 and the reception filter 111 may be provided on the same piezoelectric substrate 5 or may be provided on different piezoelectric substrates 5. FIG. 6 merely illustrates an example of a configuration of the branching filter 101, and for example, the reception filter 111 may be a ladder-form filter as in the case of the transmission filter 109. The branching filter 101 is not limited to a duplexer and may be, for example, a diplexer or may be a multiplexer including three or more filters.

(Use Example of Elastic Wave Device: Communication Device)

Figure 7:
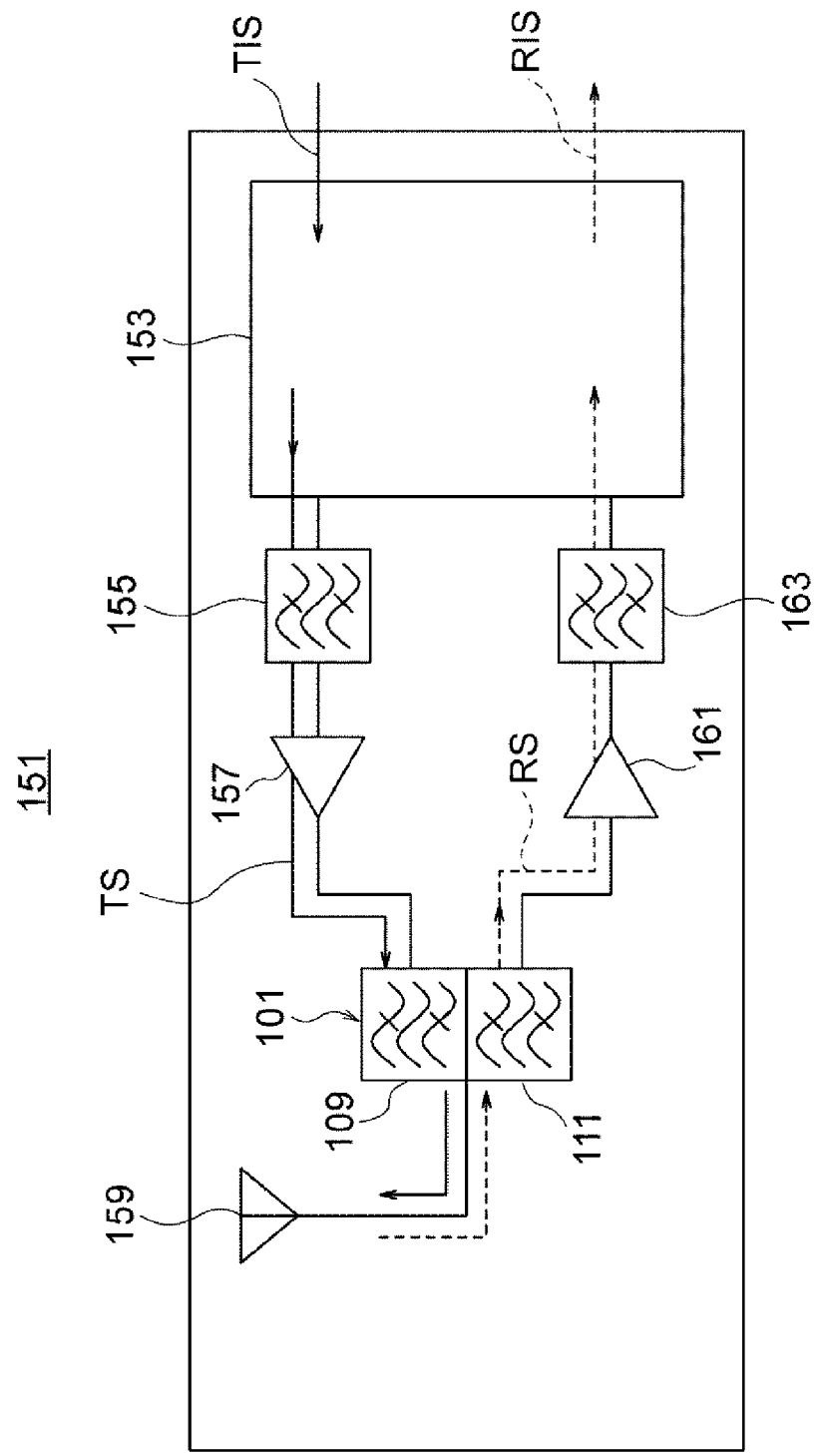
FIG. 7 is a block diagram illustrating a configuration of a substantial part of a communication device as a use example of the branching filter of FIG. 6.

FIG. 7 is a block diagram illustrating a substantial part of a communication device 151 as a use example of the SAW filter 51 (the branching filter 101 from a different perspective). The communication device 151 is for wireless communication using radio waves and includes the branching filter 101.

In the communication device 151, a transmission information signal TIS including information to be transmitted is turned into a transmission signal TS by modulation and frequency raising (conversion into a high-frequency signal having a carrier frequency) by a radio frequency integrated circuit (RF-IC) 153. The transmission signal TS is input to the branching filter 101 (the transmission terminal 105) after removal of an unnecessary component other than a pass band for transmission by a band pass filter 155 and amplification by an amplifier 157. Then, the branching filter 101 (the transmission filter 109) removes an unnecessary component other than the pass band for transmission from the input transmission signal TS and outputs the transmission signal TS from which the unnecessary component has been removed to an antenna 159 from the antenna terminal 103. The antenna 159 transmits the input electric signal (the transmission signal TS) after conversion into a radio signal (radio wave).

Furthermore, in the communication device 151, a radio signal (radio wave) received by the antenna 159 is converted into an electric signal (reception signal RS) by the antenna 159 and is then input to the branching filter 101 (the antenna terminal 103). The branching filter 101 (the reception filter 111) outputs the input reception signal RS to an amplifier 161 from the reception terminal 107 after removal of an unnecessary component other than a pass band for reception. The output reception signal RS is amplified by the amplifier 161, and an unnecessary component other than a pass band for reception is removed from the output reception signal RS by a band pass filter 163. Then, the reception signal RS is turned into a reception information signal RIS after frequency lowering and demodulation by the RF-IC 153.

Note that the transmission information signal TIS and the reception information signal RIS may be low-frequency signals (base band signals) including appropriate information and are, for example, analog audio signals or digital audio signals. A pass band of a radio signal may be set as appropriate and may be compliant with various known standards. A modulation method may be phase modulation, amplitude modulation, frequency modulation, or a combination of any two or more of these. Although a direct conversion system has been illustrated as a circuit system, other appropriate systems can be employed, for example, a double superheterodyne system may be employed. FIG. 7 schematically illustrates only a substantial part, and a low-pass filter, an isolator, and the like may be added at appropriate positions, and positions of the amplifiers and the like may be changed.

In the above embodiment and modifications, the SAW filter 51 is an example of an elastic wave filter.

The technique according to the present disclosure is not limited to the above embodiment and modifications and can be implemented in various ways.

For example, the elastic wave is not limited to a SAW. The elastic wave may be an appropriate wave for which a propagation direction along a piezoelectric substrate is conceivable and may be, for example, a bulk acoustic wave (BAW), an elastic boundary wave, or a plate wave (these waves and the SAW are not necessarily distinguishable).

As mentioned in the description of the embodiment, a length, in a direction (D2 direction) orthogonal to a direction in which an elastic wave propagates, of a region of a piezoelectric substrate where a filter body is located in a reception filter may be less than (or equal to or less than) a length combining a sum of lengths of all series resonators of the reception filter in the D2 direction and a sum of lengths of all parallel resonators of the reception filter in the D2 direction. This relationship of lengths may be applied to a filter (e.g., a transmission filter) for use other than a reception filter.

REFERENCE SIGNS LIST 1S series resonator
1P parallel resonator
5 piezoelectric substrate
51 SAW filter (elastic wave filter)
52 filter body
53 series arm
59A first split arm
59B second split arm

The invention claimed is:

1. An elastic wave filter comprising:
a piezoelectric substrate;
a first terminal;
a second terminal; and
a filter body that is provided on the piezoelectric substrate and in which a series arm including a plurality of series resonators connected in series with one another between the first terminal and the second terminal and a plurality of parallel resonators are connected in a ladder form,
wherein
the series arm has
a first split arm that extends from one side to an other side in a predetermined direction with respect to the piezoelectric substrate and includes at least one of the series resonators,
a second split arm that extends from a part of the first split arm on the other side toward the one side and includes at least one of the series resonators,
a third split arm extending from the one side toward the other side,
a first bent part that electrically connects an end of the first split arm on the other side and an end of the second split arm on the other side, and
a second bent part that electrically connects an end of the second split arm on the one side and an end of the third split arm on the one side, and
regions extended along a straight line parallel with an elastic wave propagation direction from a series resonator located closest to the first terminal from a circuit perspective among the plurality of series resonators and a parallel resonator located closest to the first terminal from a circuit perspective among the plurality of parallel resonators do not overlap a series resonator located closest to the second terminal from a circuit perspective among the plurality of series resonators and a parallel resonator located closest to the second terminal from a circuit perspective among the plurality of parallel resonators.

2. A communication device comprising:
the elastic wave filter according to claim 1;
an antenna connected to one end of the series arm; and
an IC connected to an other end of the series arm.

3. The elastic wave filter according to claim 1, wherein
a length, in a direction orthogonal to the elastic wave propagation direction, of a region of the piezoelectric substrate where the filter body is located is equal to or less than a length combining a sum of lengths of the plurality of series resonators in the direction orthogonal to the elastic wave propagation direction and a sum of lengths of the plurality of parallel resonators in the direction orthogonal to the elastic wave propagation direction.

4. A branching filter comprising:
an antenna terminal;
a transmission filter connected to the antenna terminal; and
a reception filter connected to the antenna terminal,
wherein
at least one of the transmission filter and the reception filter is the elastic wave filter according to claim 1.

5. The branching filter according to claim 4, wherein
only the reception filter is the elastic wave filter according to claim 1;
the transmission filter shares the piezoelectric substrate with the reception filter and has electrodes located on the piezoelectric substrate; and
an area of a region where the filter body is located on the piezoelectric substrate is equal to or less than a half of an area of a region where the electrodes are located.

6. An elastic wave filter comprising:
a piezoelectric substrate;
a first terminal;
a second terminal; and
a filter body that is provided on the piezoelectric substrate and in which a series arm including a plurality of series resonators connected in series with one another between the first terminal and the second terminal and a plurality of parallel resonators are connected in a ladder form,
wherein
the series arm has
a first split arm that extends from one side to an other side in a predetermined direction with respect to the piezoelectric substrate and includes at least one of the series resonators,
a second split arm that extends from a part of the first split arm on the other side toward the one side and includes at least one of the series resonators, and
regions extended along a straight line parallel with an elastic wave propagation direction from a series resonator located closest to the first terminal from a circuit perspective among the plurality of series resonators and a parallel resonator located closest to the first terminal from a circuit perspective among the plurality of parallel resonators do not overlap a series resonator located closest to the second terminal from a circuit perspective among the plurality of series resonators and a parallel resonator located closest to the second terminal from a circuit perspective among the plurality of parallel resonators,
wherein a length, in a direction orthogonal to the elastic wave propagation direction, of a region of the piezoelectric substrate where the filter body is located is equal to or less than a length combining a sum of lengths of the plurality of series resonators in the direction orthogonal to the elastic wave propagation direction and a sum of lengths of the plurality of parallel resonators in the direction orthogonal to the elastic wave propagation direction.

7. A communication device comprising:
the elastic wave filter according to claim 6;
an antenna connected to one end of the series arm; and
an IC connected to an other end of the series arm.

8. A branching filter comprising:
an antenna terminal;
a transmission filter connected to the antenna terminal; and
a reception filter connected to the antenna terminal,
wherein
at least one of the transmission filter and the reception filter is the elastic wave filter according to claim 6.

9. The branching filter according to claim 8, wherein
only the reception filter is the elastic wave filter according to claim 6;
the transmission filter shares the piezoelectric substrate with the reception filter and has electrodes located on the piezoelectric substrate; and
an area of a region where the filter body is located on the piezoelectric substrate is equal to or less than a half of an area of a region where the electrodes are located.

10. A branching filter comprising:
an antenna terminal;
a transmission filter connected to the antenna terminal;
a reception filter connected to the antenna terminal;
an elastic wave filter comprising:
  a piezoelectric substrate;
  a first terminal;
  a second terminal; and
  a filter body that is provided on the piezoelectric substrate and in which a series arm including a plurality of series resonators connected in series with one another between the first terminal and the second terminal and a plurality of parallel resonators are connected in a ladder form,
wherein
the series arm has
a first split arm that extends from one side to an other side in a predetermined direction with respect to the piezoelectric substrate and includes at least one of the series resonators, and
a second split arm that extends from a part of the first split arm on the other side toward the one side and includes at least one of the series resonators, and
regions extended along a straight line parallel with an elastic wave propagation direction from a series resonator located closest to the first terminal from a circuit perspective among the plurality of series resonators and a parallel resonator located closest to the first terminal from a circuit perspective among the plurality of parallel resonators do not overlap a series resonator located closest to the second terminal from a circuit perspective among the plurality of series resonators and a parallel resonator located closest to the second terminal from a circuit perspective among the plurality of parallel resonators,
wherein
only the reception filter of the transmission filter and the reception filter is the elastic wave filter;
the transmission filter shares the piezoelectric substrate with the reception filter and has electrodes located on the piezoelectric substrate; and
an area of a region where the filter body is located on the piezoelectric substrate is equal to or less than a half of an area of a region where the electrodes are located.

11. A communication device comprising:
the elastic wave filter according to claim 10;
an antenna connected to one end of the series arm; and
an IC connected to an other end of the series arm.

* * * * *